United States Patent [19]

Appelt et al.

[11] Patent Number: 6,015,520
[45] Date of Patent: Jan. 18, 2000

[54] METHOD FOR FILLING HOLES IN PRINTED WIRING BOARDS

[75] Inventors: Bernd Karl-Heinz Appelt, Apalachin; Christina Marie Boyko, Endicott; Donald Seton Farquhar, Endicott; Stephen Joseph Fuerniss, Endicott; Michael Joseph Klodowski, Endicott, all of N.Y.

[73] Assignee: International Business Machines Corporation, Armonk, N.Y.

[21] Appl. No.: 08/857,188

[22] Filed: May 15, 1997

[51] Int. Cl.[7] .............................. B29C 35/08; B29C 37/02
[52] U.S. Cl. ........................ 264/104; 264/162; 264/236; 264/267; 264/273
[58] Field of Search ................................ 264/130, 139, 264/162, 254, 255, 266, 267, 272.11, 272.17, 273, 274, 275, 293, 296; 29/592.1, 825, 854

[56] References Cited

U.S. PATENT DOCUMENTS

| | | | |
|---|---|---|---|
| 4,339,303 | 7/1982 | Frisch et al. | 264/230 |
| 4,424,095 | 1/1984 | Frisch et al. | 156/629 |
| 4,571,322 | 2/1986 | Eichelberger et al. | 264/267 |
| 4,764,327 | 8/1988 | Nozaki et al. | 264/225 |
| 5,240,817 | 8/1993 | Stout et al. . | |
| 5,266,446 | 11/1993 | Chang et al. . | |
| 5,367,764 | 11/1994 | DiStefano et al. . | |
| 5,443,672 | 8/1995 | Stoll et al. . | |
| 5,468,681 | 11/1995 | Pasch . | |
| 5,487,218 | 1/1996 | Bhatt et al. . | |
| 5,557,844 | 9/1996 | Bhatt et al. . | |
| 5,570,504 | 11/1996 | DiStefano et al. . | |
| 5,571,593 | 11/1996 | Arldt et al. . | |
| 5,609,889 | 3/1997 | Weber | 264/272.17 |

OTHER PUBLICATIONS

Research Disclosure 259006, Nov. 1985 (Abstract).

*Primary Examiner*—Angela Ortiz
*Attorney, Agent, or Firm*—Schmeiser, Olsen & Watts; Arthur J. Samodovitz

[57] ABSTRACT

A method for filling a hole in a printed wiring board (PWB) and the resultant PWB. During an intermediate stage in fabrication, a PWB comprises a lamination of dielectric sheets with metalizations on various layers and a plated through hole (PTH). A photoimageable material is formed on a surface of the laminate and covers the PTH. The photoimageable material in a region covering the PTH is partially cured by exposure to light. The remainder of the photoimageable material is developed away. Then, the partially cured photoimageable material in the region of the PTH is pressed into the PTH to form a plug. By application of heat during or after the forcing step, the plug is further cured to a hard condition. For some applications, the plug is mechanically abraded to be flush with one or both surfaces of the laminate. The plug can serve as a solder mask or permit another layer of low viscosity photoimageable material to be formed over the laminate such that the hole, now plugged, will not interfere with the formation of such additional layer.

27 Claims, 5 Drawing Sheets

METHOD FOR FILLING HOLES IN PRINTED WIRING BOARDS

BACKGROUND

The invention relates generally to printed wiring boards, and deals more particularly with a method for filling holes such as plated through holes in a printed wiring board.

Printed wiring boards (PWBs), such as printed circuit boards, chip carriers or multi-chip modules, are well known and comprise one or more layers of dielectric material laminated together. Some of the layers include conductors or signal lines printed on the dielectric layer and other layers may comprise a sheet of metal laminated, plated or evaporated onto the dielectric layer to serve as a ground or power plane. Typically, a surface layer includes printed conductors, metallic pads and components mounted to the pads. The components may include resistors, capacitors, amplifiers, processor chips, memory chips, application specific integrated circuits, optical devices, etc. Also, such components could be any of the foregoing electronic devices mounted on a carrier, the carrier being mounted onto the PWB. Some of the printed conductors on the surface layer connect to the pads and thereby participate in electrically connecting the respective components to other components, power and ground. However, because of surface area limitations, the surface layer may not be able to accommodate all the printed conductors that are required. Therefore, plated through holes (PTHs) and blind vias are also provided (by drilling, punching or ablating) in the PWB to interconnect printed conductors on the surface layer to printed conductors or metallic planes on inner layers. Some of these printed conductors are also connected to the surface pads to which components are mounted. Thus, the printed conductors and metallic planes on the inner layers also participate in the connections for the components on the surface layer.

The PWB undergoes additional processing after the PTHs and blind vias are formed, and the PTHs and blind vias may interfere with that processing. Typically, the PTHs and blind vias are formed through the PWB at a time when a metal sheet forms the surface of the PWB. Then, the printed conductors and surface pads are formed either using a positive or negative photolithography process, where a photoimageable material (PIM) is used to define the conductors or their compliment, and a subtractive etching or pattern plating process is used to form the features. In a subsequent manufacturing process, a PIM may also be applied for use as a solder mask or protective coating above the conductors, or as a permanent dielectric material on which an additional metal layer is deposited and subsequently circuitized.

A wide array of PIMs is available commercially in positive or negative tones, in various thicknesses, in dry or liquid form, as etch or plating resists, and for temporary use or permanent application as solder mask. In every case, the PIM is uncured initially, and is viscous and deformable, the liquid having a lower viscosity than the dry film materials. For a negative PIM, exposure to UV light through a mask partially cures the PIM, increasing its viscosity. Additional exposure, or the application of heat, will further cure the PIM and increase its viscosity to a glassy state. Temporary photoresists are typically used in the circuitized process, and are removed after the circuit lines are formed. Permanent photoresists are used for solder mask and as dielectric layers and are more resistant to chemicals used in printed wiring board fabrication processes than temporary resists.

An example of a subtractive etching process using a PIM follows. After drilling the PTHs and blind vias, the entire printed wiring board is plated with copper 0.7 mils thick, including the surface, the PTHs and vias. Then a dry film negative PIM such as Hercules CFI 1.3 is applied over the copper metal layer. Selected portions of the PIM in the shape of the desired conductors are cured by ultraviolet (UV) light passing through a mask. After UV light exposure, the uncured portions of the PIM are developed or washed away with 1% solution of sodium carbonate. The now exposed portions of the copper metal sheet are then removed using a wet etching process with chemicals such as cupric chloride to form the printed conductors underneath the cured portions of the PIM. Then, the cured portions of the PIM are removed using a stripper such as duPont S1100x.

An example of the use of a PIM in pattern plating is as follows. After the PTHs and blind vias are formed by drilling or other means, a thin layer (100 micro-inches or less) of copper is plated electrolessly (or otherwise deposited) onto the entire printed wiring board surface and the walls of the PTHs and blind vias. Then a dry film PIM such as Hercules CFI 1.3 is applied over the thin copper layer. Then selected portions of the PIM in the complimentary shape of the desired conductors are cured by UV light passing through a mask. Then, the uncured portions of the PIM are developed or washed-away using a solution of sodium carbonate. Then, the thin metal sheet is electrically connected to a common potential, and the exposed portions of the thin metal sheet are electrically plated with copper to the desired thickness to form the printed conductors. Finally, the cured PIM is removed using duPont S1100x stripper, and the thin copper layer that was underneath the cured PIM is removed by a flash etch using an aqueous solution of cupric chloride.

An example of a use of PIM in a solder mask application is as follows. A liquid PIM such as Taiyo PSR-4000 AUS-5 is applied over the metal layer after it has been circuitized. Then the PIM is exposed to UV light through a mask with the desired pattern of the solder mask. The unexposed solder mask is then washed away in a developing solution such as 1% sodium carbonate and the mask is then fully cured. The purpose of the solder mask is to protect the circuitry on the top layer of the printed wiring board, and to restrict the flow of solder in any subsequent assembly process.

An example of use of a PIM as a permanent dielectric layer is as follows. A dry film PIM such as Morton Chemical's Laminar LB-404 is applied over the circuitized metal layer, PTHs and blind vias. The PIM is then exposed with UV light everywhere except where holes called photovias are intended for subsequent connection to underlying metal layer. The PIM is then developed with propylene carbonate to remove unexposed PIM from the photovias and then the PIM is fully cured. Next a copper plating process is used to plate the photovias and the surface of the PIM. The surface copper is then subtractively circuitized to form conductors on top of the permanent PIM. Finally, another PIM may be applied as a solder mask as described above.

In each of the printed wiring board fabrication steps described above, certain problems can arise in the use of PIMs due to the presence of holes in the printed wiring board. Despite the viscosity of the PIM when initially applied to the surface of the printed wiring board, the PIM may sag into the PTHs or blind vias and yield a non-planar surface of the PIM. This non-planarity degrades the resolution of the subsequent curing process because the UV mask is shaped for a planar surface and the depth of field is very limited.

Furthermore, the PIM applied to the surface of printed wiring board may not be able to tent across the diameter of the PTH without rupturing. In the case of a PIM used for circuitization, such rupturing could allow corrosive process chemicals into the PTH, resulting in damage to the PTH. In the case of a permanent PIM used as a solder mask, a ruptured tent would allow solder or flux to enter the PTH, causing damage to the PTH and disrupting the assembly process. Similarly, liquid adhesives that are used to reinforce surface mounted components such as integrated circuits may seep into the holes, wasting adhesive and even contaminating the back side of the PWB. To avoid ruptured tents over holes in the printed wiring board, thicker and less conformable photoresists are required, resulting in a greater standoff and poorer resolution. Moreover, in order for such photoresist to be properly adhered over the PTH, it must extend appreciably beyond the inner diameter of the PTH. This results in wasted surface area on the printed wiring board by resulting in larger lands around the PTHs in the circuitize process. In the case of a PIM used as solder mask, less of the printed wiring board surface is available for pads used for interconnecting surface mounted components. In one approach to conserving surface area, U.S. Pat. No. 5,487, 218 discloses a conductive fill material within PTHs. A component such as an integrated circuit on a carrier is soldered directly over the filled PTH. Consequently, it is not necessary to utilize additional surface area to provide a printed conductor leading to a pad which receives the component. Likewise, free ends of wires of wire-bonded components can be connected directly over the PTH instead of to a pad spaced from the PTH. U.S. Pat. No. 5,487,218 also discloses a method for filling the PTHs with the conductive fill material by first applying the fill material to a sheet of copper, placing the sheet over the PWB and then using a vacuum to draw the fill material into the holes. While this filling method is effective, an alternate filling method would be desirable in some circumstances.

A general object of the present invention is to provide a technique to fill PTHs and blind vias in a simple and effective manner.

SUMMARY OF THE INVENTION

The invention resides in a method for filling a hole in a printed wiring board (PWB) and the resultant PWB. During an intermediate stage in fabrication, a PWB comprises a lamination of dielectric sheets with metalizations on various layers and a plated through hole (PTH). A photoimageable material is formed on a surface of the laminate and covers the PTH. The photoimageable material in a region covering the PTH is partially cured. The remainder of the photoimageable material is developed away. Then, the partially cured photoimageable material in the region of the PTH is forced into the PTH to form a plug. During or after the forcing step, the plug is further cured. For some applications, the plug is mechanically abraded to be flush with one or both surfaces of the laminate. The plug can serve as a solder mask and or permit another layer of low viscosity photoimageable material or other low viscosity material to be formed over the laminate such that the hole, now plugged, will not interfere with the formation of such additional layer.

According to another embodiment of the present invention, the photoimageable material which is originally formed on the surface of the laminate to ultimately plug the hole has a low viscosity and partially seeps into the PTH before being forced therein.

DETAILED DESCRIPTION OF THE PREFERRED EMBODIMENTS

Figure 1A:
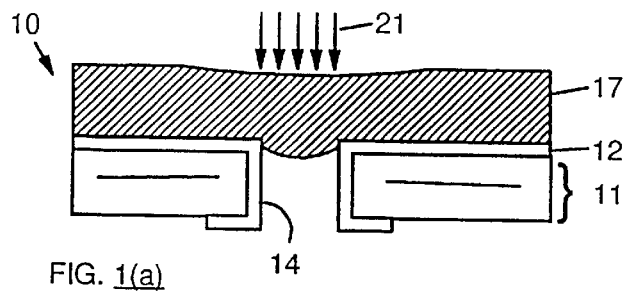
FIG. 1(a) is a cross-sectional view of a PWB during an intermediary stage in the fabrication process according to the present invention.

Referring now to the drawings in detail wherein like reference numbers indicate like elements throughout the Figures, FIG. 1(a) illustrates a Printed Wiring Board (PWB) generally designated 10 during an intermediary stage in a fabrication process according to the present invention. The term "Printed Wiring Board" as used herein includes printed circuit boards, chip carriers and multi-chip modules. At this stage, PWB 10 comprises multiple dielectric layers 11 which have been laminated together. By way of example, each dielectric layer comprises a layer of polyimide, epoxy, BT (Bismaleimide Triazine) or fluoro-polymer material which may be reinforced with inorganic or organic fibers or fillers. The following previously-known dielectric materials are examples of suitable materials—IBM Driclad (tm) material, Rogers RO2800 material or E. I. DuPont de Nemours Kapton material. Some of the internal dielectric layers have conductors (not shown) printed thereon, and other of the internal dielectric layers may include a metal sheet (not shown) which serves as a ground or power plane. At this stage in the fabrication process, a metal layer 12, for example, a sheet of copper 0.5–1.0 mil thick, is laminated, plated or evaporated onto the outermost dielectric sheet. A hole has been drilled, punched or ablated through the dielectric layers and metal layer 12, and then plated with another metal layer to form a PTH 14 with a height in the range of 2–300 mils. By way of example, the inner diameter of the hole is in the range of 2–50 mils.

The metal layer 12 may now be circuitized prior to a hole fill process described below using the subtractive etching process or the pattern plating process described in the background. Alternately, the same circuitization processes can be performed after the holefill process. In both cases, processing subsequent to circuitization of metal layer 12 may include the addition of a permanent PIM with photovias, or the addition of a solder mask after the holefill process. The foregoing fabrication steps are all well known. Further details of these and alternate fabrication steps can be obtained from "Principles of Electronic Packaging" by Donald P. Seraphim, Ronald Lasky and Che-Yu Li published by McGraw-Hill Book company, N.Y. 1988, and "Microelectronic Packaging Handbook" by Rao Tummala and Eugene J. Rymaszewski published by Van Nostrand Reinholt, N.Y. 1988.

The following is a hole fill process according to the present invention. A layer 17 of photoimageable material (PIM) of substantially uniform thickness is applied over metal layer 12 and PTH 14. By way of example, the PIM comprises Morton Chemical Laminar LB-404 material in dry film form, Taiyo SR-4000 AUS-5 in liquid form, Taiyo PSR 4000 H84 in liquid form, Enthone DSR 3241 in liquid form or duPont Vacrel/Riston in a dry film form. The room temperature starting viscosity of the dry film materials ranges from 200,000 to 20,000,000 poise, whereas the liquid materials fall in range of 200 to 2000 poise. Preferably, the PIM thickness is two mils greater than the height of PTH 14, and can be 2 to 50 mils thick, depending on the height of the PTH 14. The PIM may also be "filled" with copper particles to enhance heat and/or electrical conduction and permit solder connection of an electronic component directly to the PIM remaining in the PTH 14. Alternately, the PIM may be filled with ceramic particles such as silica or aluminum nitride to enhance thermal conductivity and reduce the coefficient of thermal expansion. In either case, the fill particles can be up to 25 um but less than a screen mesh, if the filled PIM is applied by screening. The fill particles, if opaque, could comprise up to about 50% of the volume of the PIM.

The viscosity of the PIM can be altered to meet the following processing requirements by altering the chemical structure of the monomer, by changing the amount of liquid monomer, by adding a thixotropic agent such as silica fillers, by diluting the PIM with a solvent such as propylene glycol monomethyl ether, or by partially curing/cross-linking the polymer. Liquid can be applied by roller or slot coating, or screen coating by applying the PIM as a blob and then spreading the PIM with a blade. Dry film PIM may be hot roll laminated or vacuum laminated to the surface of metal layer 12 using conventional manufacturing equipment. The dry film PIM then requires heat and pressure to conform the PIM to surface topography. Temperatures of 90–120 degrees C. and pressures of 5–15 psi applied for 1–2 minutes are sufficient to lower the viscosity and conform the dry film to the surface topography.

Figure 1B:
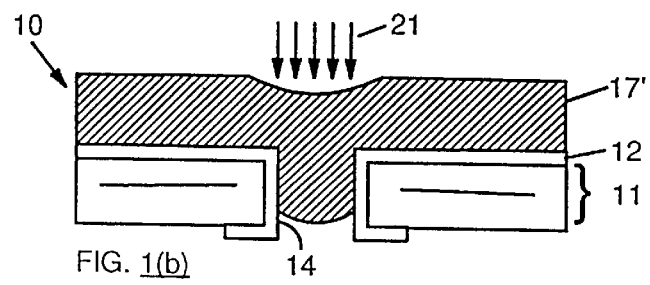
FIG. 1(b) is a cross-sectional view of a PWB during an intermediary stage in an alternate fabrication process according to the present invention.

The amount which the PIM sags or seeps into PTH 14 depends on the viscosity of the PIM and diameter of the PTH and is affected by gravity and capillary forces and any external forces that are applied during processing. FIG. 1(a) illustrates a relatively small amount of sagging/seepage whereas FIG. 1(b) illustrates a relatively large amount of sagging/seepage. The less viscous PIM also tends to conform well to surface topography without application of pressure.

Figure 2A:
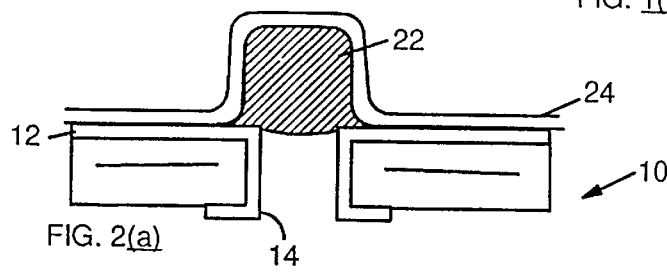
FIG. 2(a) is a cross-sectional view of the PWB of FIG. 1(a) during a subsequent stage in the fabrication process.
Figure 2B:
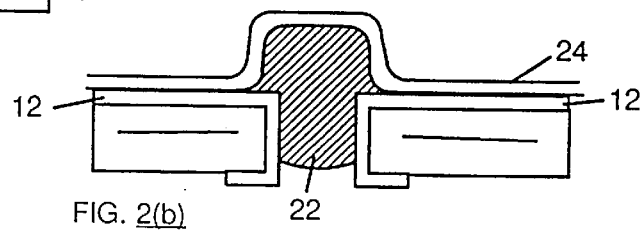
FIG. 2(b) is a cross-sectional view of the PWB of FIG. 1(b) during a subsequent stage in the fabrication process.
Figure 3:
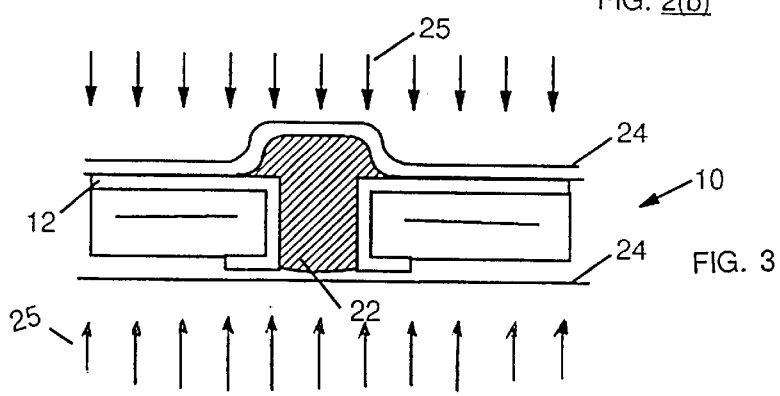
FIG. 3 is a cross-sectional view of the PWB of FIG. 2 during a subsequent stage in the fabrication process.
Figure 4:
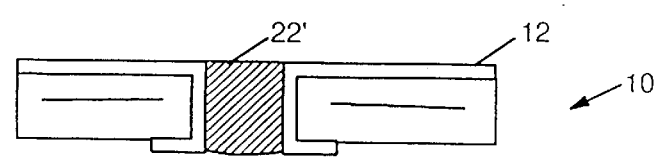
FIG. 4 is a cross-sectional view of the PWB of FIG. 3 during a subsequent stage in the fabrication process.

After application of the PIM, artwork matching the PTH 14 (and all other holes in the metal sheet 12) is prepared and registered with PTH 14 such that the region of the PIM over PTH 14 (and all other holes in the metal sheet 12) will be exposed to UV light 21 to cure/cross-link the exposed PIM and to render the PIM resistant to a subsequent solvent development process. It also renders the PIM solid (but not necessarily completely cured) at room temperature. The artwork is such a size that the exposed region of the PIM over PTH 14 will be approximately 1 mil larger in diameter than the specified inner diameter of the PTH 14. This accounts for tolerance in the formation of the PTH 14 and registration of the artwork with the PTH 14. This also ensures that sufficient cross-section of PIM remains to completely fill PTH 14 as described below. (Alternately, for a thin PWB such as a chip carrier, no external photomask is required; instead, the UV light is shined upwardly through PTH 14 and any other holes to cure the PIM above PTH 14 and any other holes.) The exposed PIM is preferably cured less than 100%, for example 20–80%, so that it will not flow at room temperature, but will flow at elevated temperature and conform to the shape of the hole in PTH 14 under pressure as described below. Next, the unexposed PIM is removed using a solvent based developing solution such as propylene carbonate for Laminar LB-404 or 1% sodium carbonate for aqueous-processed PIMs. This leaves a "plug" 22 of the partially cured PIM material over PTH 14 (and all other holes) as illustrated in FIG. 2(a) for the PIM layer 17 of FIG. 1(a) and FIG. 2(b) for the PIM layer 17 of FIG. 1(b). Next, both sides of the PWB 11 including PIM plug 22 (and all other PIM plugs) are overlaid with a Teflon (tm of E. I. duPont deNemours) release sheet 24, for example, 0.5–5.0 mils thick as illustrated in FIGS. 2(a) and 2(b). Then, pressure 25 is applied over Teflon sheet 24 using a flat bed press or an autoclave while the PWB 10 is heated to 150 degrees C. to soften plug 22 (and all other plugs) and force plug 22 (and all other plugs) into PTH 14 (and all other holes) as illustrated in FIG. 3. The amount of pressure depends on the degree of curing of PIM plug 22 and the size of PTH 14 (and any other holes). For a PIM comprised of 12 mil thick Laminar LB-404 material cured to 50% by UV exposure and a PTH 14 inner diameter of 10 mils and depth of 10 mils, a suitable pressure is 50–100 psi and a suitable temperature is 150 degrees C. The foregoing exposure to pressure and heat also completes the curing of the PIM plug 22 (and all other plugs). Then, the release sheet 24 is removed. Typically, the plug 22 will protrude outwardly from one or both surfaces of the PWB 10. For some applications of the present invention such as use of the plug 22 as a solder mask for PTH 14, plug 22 need not be flush with the surfaces of PWB 10 and is used in the final product as illustrated in FIG. 3 (without the release sheet). In this application, it should be noted that the solder mask plug does not extend much, if at all, beyond the inner diameter of PTH 14, and therefore does not waste surface area as does the solder mask surface patch described in the Background of the Present Invention. For other applications of the present invention such as described below, the protrusion of plug 22 from one or both faces of PWB 10 can be removed by mechanical polishing or a chemical hole cleaning solution that is capable of removing cured epoxy. The resultant flush plug 22' is illustrated in FIG. 4.

Figure 5:
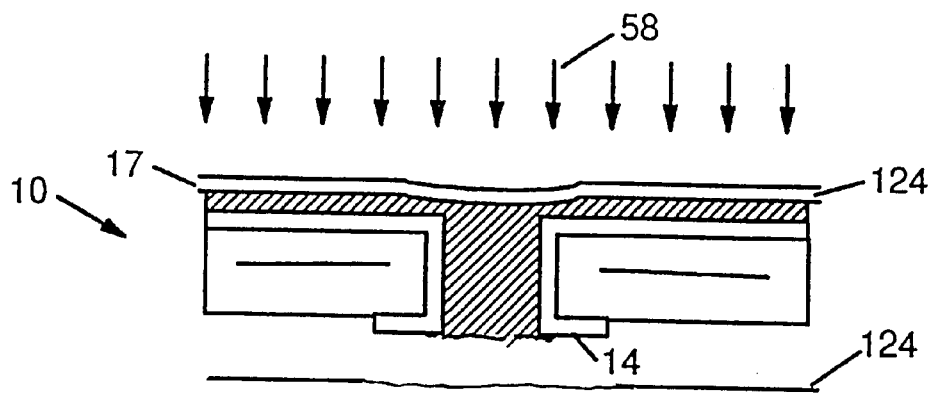
FIG. 5 is a cross-sectional view of the PWB of FIGS. 1(a) or 1(b) during a subsequent stage in another fabrication process according to the present invention.
Figure 6:
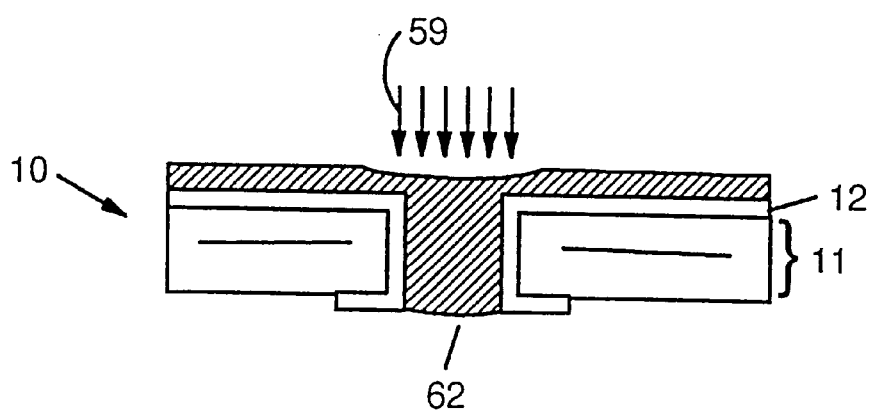
FIG. 6 is a cross-sectional view of the PWB of FIG. 5 during a subsequent stage in this other fabrication process.
Figure 7:
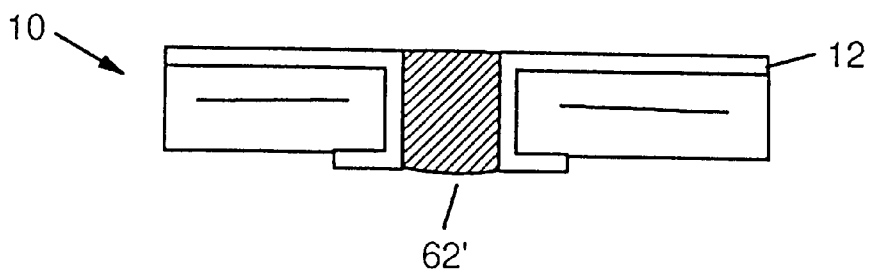
FIG. 7 is a cross-sectional view of the PWB of FIG. 6 during a subsequent stage in this other fabrication process.

FIGS. 5–7 illustrate another fabrication process according to the present invention. PIM 17, in liquid form, is first applied to the surface of metal layer 12 as illustrated in FIG. 1(*a*) or 1(*b*) and described above. Preferably, the viscosity of the liquid PIM 17 is in the range of 200 to 2000 poise. After the PIM 17 is applied over the surface of metal layer 12, a release sheet 124, for example, 1 mil thick and comprising Mylar polyester, is laid over the PIM and the underside of PWB 10 and then pressure 58 is applied using a flat bed press or autoclave or hot roll laminator or vacuum laminator to force PIM 17 into PTH 14 (and all other holes) as illustrated in FIG. 5. For the liquid PIM comprised of 12 mil thick Taiyo PSR-4000 AUS-5 material with a viscosity of 250 poise and a PTH inner diameter of 10 mil and depth of 10 mil, a suitable pressure is 15 psi. Alternately, a dry film PIM such as Laminar LB-404, typically supplied with a polyester release sheet on one side, can be used instead of the liquid PIM described above. For the dry film PIM comprised of 12 mil material with a viscosity of 1,000,000 poise and a PTH inner diameter of 10 mils and depth of 10 mils, a suitable pressure is 100 psi. The temperature may be elevated to 95–120 degrees C. for 2 minutes during the application of the pressure to reduce the viscosity of the PIM; however, such temperature should be low enough to prevent cross-linking of PIM 17.

For both the liquid and dry film PIM 17, the pressure tends to flatten the PIM 17 on the surface of metal layer 12 and forces PIM 17 into PTH 14 (and all other holes) as illustrated in FIG. 5. However, the pressure should be moderated such that the lowest point in the surface of the PIM 17 over PTH 14 does not fall below the surface of metal layer 12. Then, a mask is used to direct UV light 59 over PTH 14 (and any other holes) and cure the PIM within PTH 14 (and any other holes) but not cure the remainder of the PIM on the surface of metal layer 12. Alternately, the UV light exposure can be accomplished by shining light upwardly through PTH 14 and any other holes to cure the PIM above the holes. A plug 62 is thus formed in and above PTH 14 (and other plugs in other holes) as illustrated in FIG. 6. Next the uncured remainder of the PIM on the surface of metal layer 12 is removed using an appropriate solvent leaving cured plug 62 in PTH 14 (and other cured plugs in other holes). Typically, the cured plug 62 will protrude outwardly from one or both surfaces of the PWB 10, and this may be suitable for use as a solder mask. However, for other applications where a planar surface is required, the protrusion can be removed by mechanical polishing or chemical hole cleaning as described above. The resultant, flush plug 62' is illustrated in FIG. 7.

FIGS. 8–11 illustrate another hole fill process according to the present invention. In general, the hole fill process of FIGS. 8–11 is similar to the hole fill process of FIGS. 1(*a*), 2(*a*), 3 and 4 except that the original PIM layer 117 used in FIGS. 8–11 is thinner than the PWB such that the resultant plug 122' does not completely fill the PTH 14. Nevertheless, the resultant plug is useful to provide a flush seal and support surface to the top of PTH 14.

Figure 8:
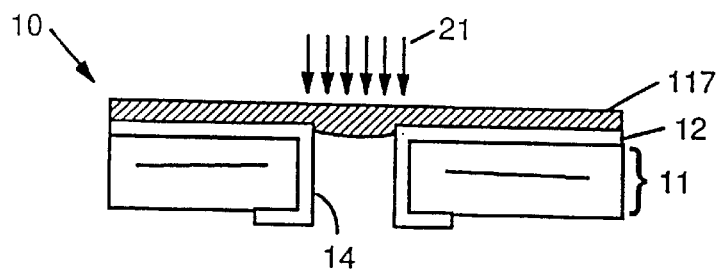
FIG. 8 is a cross-sectional view of a PWB during an intermediary stage in an alternate fabrication process according to the present invention. The intermediary stage of FIG. 8 can substitute for the intermediary stage of FIG. 1(a) or FIG. (b).

As illustrated in FIG. 8, a layer 117 of photoimageable material (PIM) of substantially uniform thickness is applied over metal layer 12 and PTH 14. PIM 117 may comprise any of the materials and be applied to metal layer 12 as described above for PIM 17 except the viscosity of PIM 117 when applied onto metal layer 12 should be high enough so that PIM 117 does not seep into PTH 14. In this embodiment of the present invention, the PIM 117 thickness is less than the height of PTH 14, but at least 2 mils thick.

Figure 9:
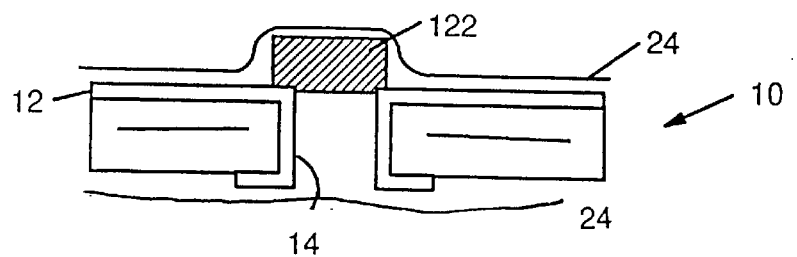
FIG. 9 is a cross-sectional view of the PWB of FIG. 8 during a subsequent stage in the fabrication process.
Figure 10:
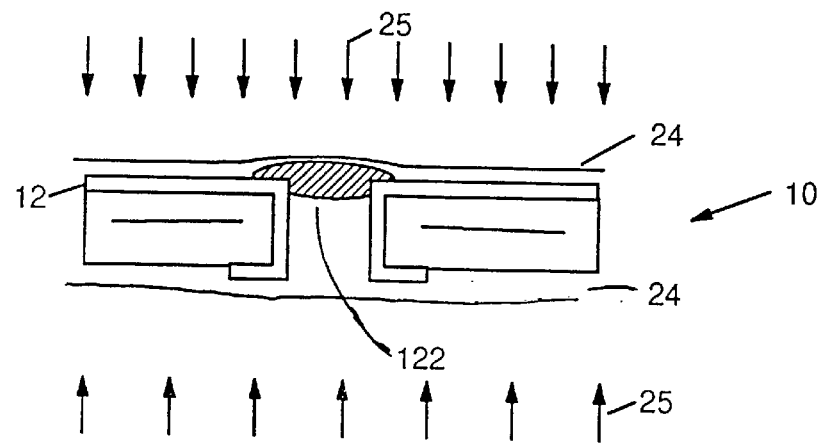
FIG. 10 is a cross-sectional view of the PWB of FIG. 9 during a subsequent stage in the fabrication process.
Figure 11:
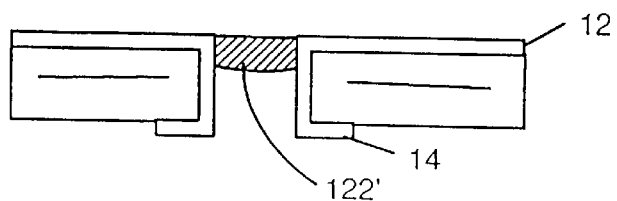
FIG. 11 is a cross-sectional view of the PWB of FIG. 10 during a subsequent stage in the fabrication process.

After application of the PIM 117, artwork matching the PTH 14 (and all other holes in the metal layer 12) is prepared and registered with PTH 14 such that the region of the PIM 117 over PTH 14 (and all other holes in the metal sheet 12) will be exposed to UV light 21 to cure/cross-link the exposed PIM and to render the PIM resistant to a subsequent solvent development process. It also renders the PIM solid (but not necessarily completely cured) at room temperature. The artwork is such a size that the exposed region of the PIM over PTH 14 will be approximately 1 mil larger in diameter than the specified inner diameter of the PTH 14. This accounts for tolerance in the formation of the PTH 14 and registration of the artwork with the PTH 14. This also ensures that sufficient cross-section of PIM remains to snugly fill PTH 14 as described below. (Alternately, for a thin PWB such as a chip carrier, no external photomask is required; instead, the UV light is shined upwardly through PTH 14 and any other holes to cure the PIM above PTH 14 and any other holes.) The exposed PIM is preferably cured less than 100%, for example 20–80%, so that it will not flow at room temperature, but will flow at elevated temperature and conform to the shape of the hole in PTH 14 under pressure as described below. Next, the unexposed PIM is removed using a solvent based developing solution such as propylene carbonate for Laminar LB-404 or 1% sodium carbonate for aqueous-processed PIMs. This leaves a "plug" 122 of the partially cured PIM material over PTH 14 (and all other holes) as illustrated in FIG. 9. Next, the top side of the PWB 11 including PIM plug 122 (and all other PIM plugs) is overlaid with Teflon (tm of E. I. duPont de Nemours) release sheet 24 as illustrated in FIGS. 9 and 10. Then, pressure 25 is applied over Teflon sheet 24 using a flat bed press or an autoclave while the PWB 10 is heated to 150 degrees C. to soften plug 122 (and all other plugs) and force plug 122 (and all other plugs) into PTH 14 (and all other holes) as illustrated in FIG. 10. The amount of pressure depends on the degree of curing of PIM plug 122 and the size of PTH 14 (and any other holes). For a PIM comprised of 12 mil thick Laminar LB-404 material cured to 50% by UV exposure and a PTH 14 inner diameter of 10 mils and depth of 10 mils, a suitable pressure is 50–100 psi and a suitable temperature is 150 degrees C. The foregoing exposure to pressure and heat also completes the curing of the PIM plug 122 (and all other plugs). Then, the release sheet 24 is removed. The plug 122 may protrude outwardly from the top surfaces of the PWB 10. For some applications of the present invention such as use of the plug 122 as a solder mask for PTH 14, plug 122 need not be flush with the surfaces of PWB 10 and is used in the final product as illustrated in FIG. 10 (without the release sheet). In this application, it should be noted that the solder mask plug does not extend much, if at all, beyond the inner diameter of PTH 14, and therefore does not waste surface area as does the solder mask surface patch described in the Background of the Present Invention. For other applications of the present invention such as described below, the protrusion of plug 122 from the top face of PWB 10 can be removed by mechanical polishing or a chemical hole cleaning solution that is capable of removing cured epoxy. The resultant flush plug 122' is illustrated in FIG. 11.

Figure 12:
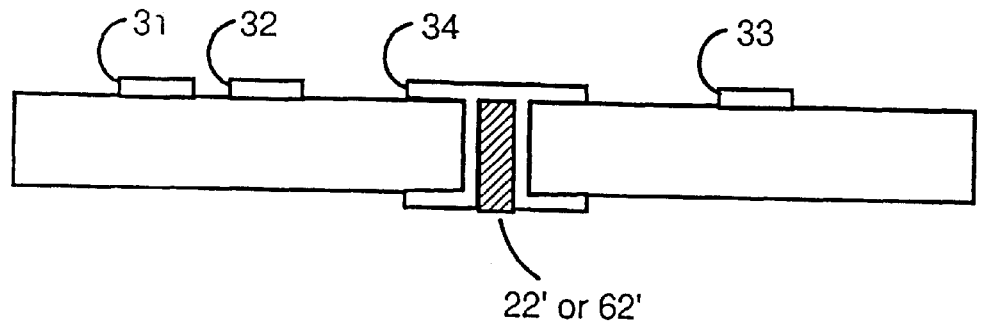
FIG. 12 is a cross-sectional view of the PWB of FIGS. 4 or 7 during a subsequent stage in the fabrication process.

If metal layer 12 was not circuitized prior to any of the foregoing holefill processes, it may now be circuitized following the methods described in the Background. For example, using the pattern plating process of circuitization, conductors 31, 32, 33 and 34 can be formed, with conductor 34 being formed above the flush plug 22' or 62' as shown in FIG. 12. To the extent the pattern plating process requires removal of an additional temporary layer of photoresist (not shown) comprising 1 or 2 mils above plug 22' or 62' comprising Hercules CFI 1.3, such removal is made by a solution of sodium hydroxide which will not remove the plug 22' or 62'.

Figure 13:
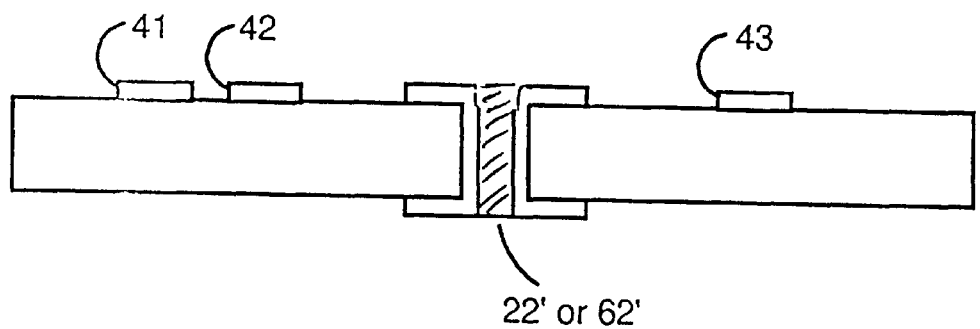
FIG. 13 is a cross-sectional view of the PWB of FIGS. 4 or 7 during a subsequent stage in the fabrication process.

A subtractive circuit process can also be used instead of the pattern plating process, to form conductors 41, 42 and 43 from metal layer 12 as shown in FIG. 13. To the extent the sub stractive circuit process requires removal of an additional layer of photoresist (not shown) comprising 1 or 2 mils above plug 22' or 62' comprising Hercules CFI 1.3, such removal is made by a solution of sodium hydroxide which will not remove the plug 22' or 62'.

Figure 14:
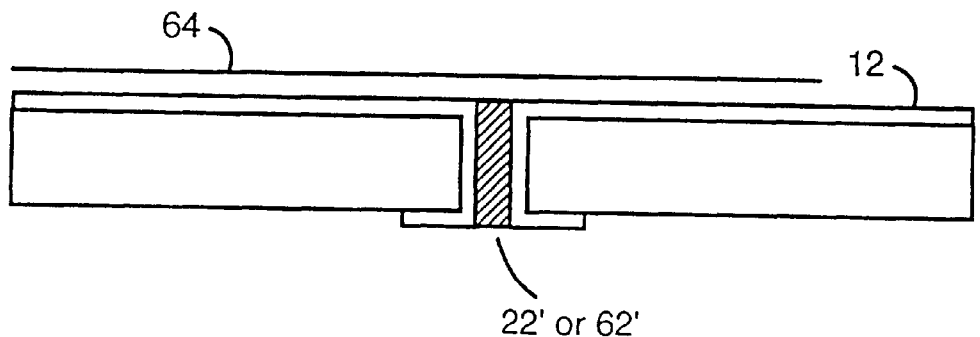
FIG. 14 is a cross-sectional view of the PWB of FIGS. 4 or 7 during a subsequent stage in the fabrication process.
Figure 15:
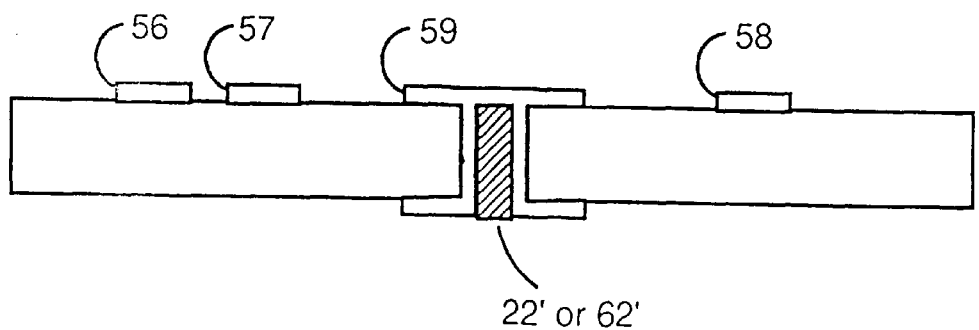
FIG. 15 is a cross-sectional view of the PWB of FIG. 14 during a subsequent stage in the fabrication process.

Metal layer 64 can also be blanket plated above metal layer 12 and covering flush plug 22' or 62' as shown in FIG. 14 prior to subtractively etching conductors 56, 57, 58 and conductor 59 as shown in FIG. 15 with conductor 59 being above flush plug 22' or 62'. To the extent the substractive etching process requires removal of an additional layer of photoresist (not shown) comprising 1 or 2 mils above plug 22' or 62' comprising Hercules CFI 1.3, such removal is made by a solution of sodium hydroxide which will not remove the plug 22' or 62'.

Figure 16:
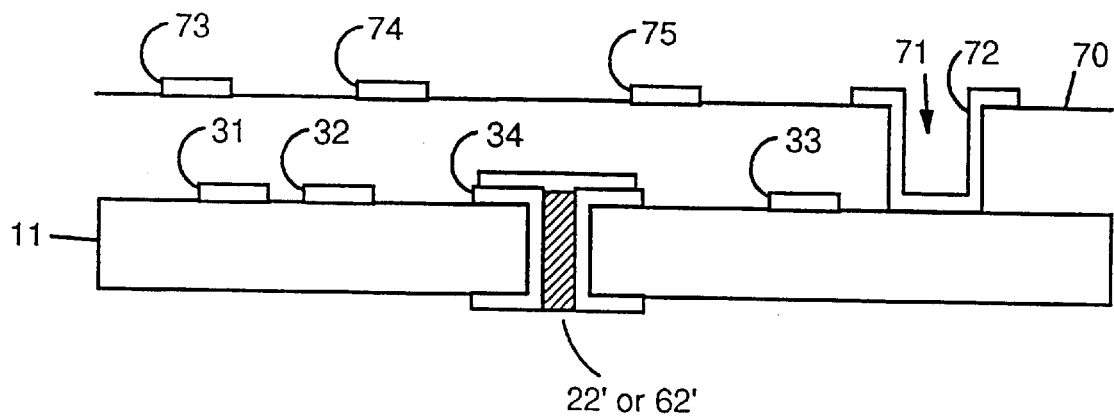
FIG. 16 is a cross-sectional view of the PWB of FIGS. 12 during a subsequent stage in the fabrication process.

FIG. 16 shows another extension to the foregoing processing in which a dielectric layer 70 is added onto dielectric layers 11 and circuitization 31, 32, 33 and 34. Circuitization 31–34 was fabricated according to the method depicted in FIGS. 12-13 or 15. In one example dielectric layer 70 is a permanent PIM which is subsequently processed as described in the Background to form photovias 71 with a metallization 72 and circuitization 73, 74 and 75.

Figure 17:
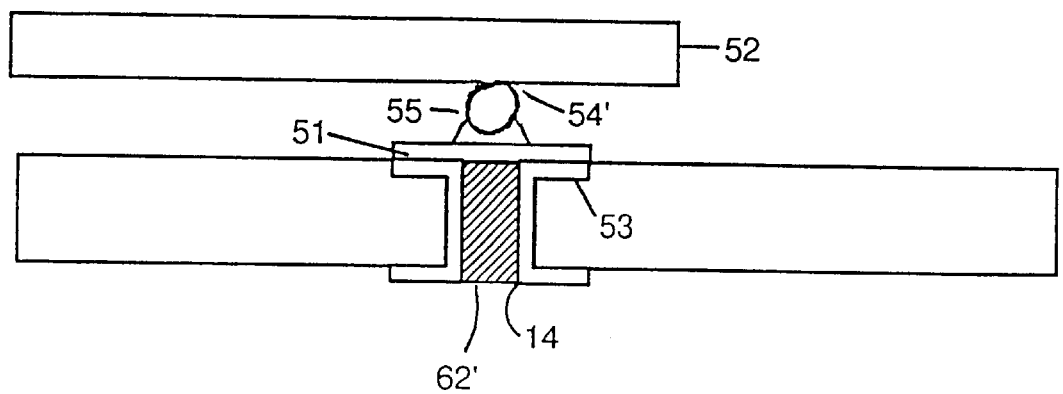
FIG. 17 is a cross-sectional view of FIGS. 16 during a subsequent stage of fabrication.

FIG. 17 shows an example of an application for the invention, where an electronic component 52, such as an integrated circuit mounted on a carrier, is soldered to the regional copper layer 51 as follows. A solder ball 54 is applied to the underside of electronic component 52, positioned over regional copper layer 51/PTH 14 and then reflowed. If desired, solder ball 54 can have a relatively high melting point, and relatively low melting point solder paste 55 can be applied to the underside of the solder ball or on top of the regional copper layer 51. Then the solder paste is reflowed (below the melting point of solder ball 54) to interconnect the solder ball 54 to the regional copper layer 51.

Based on the foregoing, methods for filling PTHs and blind vias which pass through a surface layer of a PWB have been disclosed. Also, methods for fabricating a PWB using the foregoing hole fill method and for attaching an electronic component to the PWB have been disclosed. However, numerous modifications and substitutions can be made without deviating from the scope of the present invention. Therefore, the present invention has been disclosed by way of illustration and not limitation and reference should be made to the following claims to determine the scope of the present invention.

What is claimed is:

1. A method for filling a hole in a printed wiring board (PWB), said method comprising the steps of:

forming a layer of photoimageable material on a surface of said PWB, a hole passing through said PWB, said photoimageable material covering said hole;

at least partially curing said photoimageable material in a region covering said hole; and forcing said at least partially cured photoimageable material into said hole.

2. A method as set forth in claim 1 wherein the photoimageable material is not fully cured before the forcing step; and further comprising the step of completing the curing of said photoimageable material during or after the forcing step.

3. A method as set forth in claim 1 wherein said region has approximately the same shape as and is approximately centered over said hole.

4. A method as set forth in claim 1 wherein said region is approximately centered over hole, covers said hole and covers a surrounding fringe of said PWB surrounding said hole.

5. A method as set forth in claim 1 wherein a surface layer of said PWB comprises a metal sheet; and further comprising the subsequent step of applying another layer of liquid or viscous photoimageable material over said metal sheet.

6. A method as set forth in claim 5 further comprising the subsequent step of selectively curing said other layer of photoimageable material.

7. A method as set forth in claim 5 wherein a surface layer of said PWB comprises a metal sheet; and further comprising the subsequent step of curing said other layer of photoimageable material and printing conductors on a surface of said cured other layer of photoimageable material.

8. A method as set forth in claim 1 wherein said photoimageable material is conductive; and further comprising the subsequent step of soldering a lead or contact of an electronic component to said conductive photoimageable material in said hole.

9. A method as set forth in claim 1 wherein the photoimageable material is not fully cured before the forcing step; and further comprising the step of heating said photoimageable material during the forcing step, the heat further curing said photoimageable material.

10. A method as set forth in claim 1 wherein said forcing step is performed by applying pressure to said photoimageable material.

11. A method as set forth in claim 1 further comprising the step of removing photoimageable material which is not in said region, said removing step being performed between the curing and forcing steps.

12. A method as set forth in claim 11 wherein said removing step is performed by using a developing solution to wash away photoimageable material which is not substantially cured.

13. A method as set forth in claim 1 further comprising the step of curing, to a hard condition, said photoimageable material that has been forced into said hole and then abrading said hard photoimageable material in said hole flush with at least one surface of said PWB.

14. A method as set forth in claim 13 further comprising the step of forming another layer of photoimageable material over said surface of said PWB including the hard photoimageable material within said hole.

15. A method as set forth in claim 1 wherein a thickness of said layer of photoimageable material is greater than a depth of said hole, whereby after the photoimageable material is forced into said hole said photoimageable material completely fills said hole.

16. A method as set forth in claim 1 wherein a thickness of said layer of photoimageable material is less than a depth of said hole, whereby after the photoimageable material is forced into said hole said photoimageable material does not completely fill said hole but fills one end of said hole.

17. A method as set forth in claim 1 wherein said hole is a plated through hole.

18. A method as set forth in claim 1 wherein said photoimageable material within said hole forms a plug for said hole.

19. A method as set forth in claim 1 further comprising the step of plating said hole to form a plated through hole before the step of forming a layer of photoimageable material on a surface of said PWB.

20. A method as set forth in claim 1 wherein said surface of said PWB comprises a surface of a metal sheet.

21. A method as set forth in claim 20 further comprising the step of forming a circuitization from said metal sheet after said forcing step.

22. A method as set forth in claim 1 wherein the step of at least partially curing said photoimageable material in a region covering said hole is performed by exposure to light.

23. A method as set forth in claim 22 wherein said exposing step is performed using a mask.

24. A method as set forth in claim 22 wherein said exposing step is performed by shining said light from an underside of said hole, into said hole and against an underside of said photoimageable material covering said hole.

25. A method as set forth in claim 1 wherein said photoimageable material is a dry film and has viscosity in the range of 200,000 to 20,000,000 poise when applied to said surface of said PWB, and said step of at least partially curing said photoimageable material in a region covering said hole is performed by exposure to light.

26. A method as set forth in claim 1 wherein said photoimageable material is a liquid and has viscosity in the range of 200 to 2,000 poise when applied to said surface of said PWB, and said step of at least partially curing said photoimageable material in a region covering said hole is performed by exposure to light.

27. A method as set forth in claim 1, wherein said surface of said PWB comprises a surface of a metal sheet, wherein said metal sheet is circuitized, and wherein said layer of photoimageable material is formed on said circuitized metal sheet.

* * * * *